United States Patent
Simmons

(10) Patent No.: US 10,666,251 B2
(45) Date of Patent: May 26, 2020

(54) TARGET MAGNET MECHANISM FOR PROXIMITY SWITCH

(71) Applicant: General Equipment and Manufacturing Company, Inc., Louisville, KY (US)

(72) Inventor: Michael Simmons, Louisville, KY (US)

(73) Assignee: General Equipment and Manufacturing Company, Inc., Louisville, KY (US)

( * ) Notice: Subject to any disclaimer, the term of this patent is extended or adjusted under 35 U.S.C. 154(b) by 107 days.

(21) Appl. No.: 15/896,888

(22) Filed: Feb. 14, 2018

(65) Prior Publication Data

US 2019/0253052 A1    Aug. 15, 2019

(51) Int. Cl.
| | | |
|---|---|---|
| *H01H 9/00* | (2006.01) | |
| *H03K 17/95* | (2006.01) | |
| *H01H 36/00* | (2006.01) | |
| *H01H 11/00* | (2006.01) | |
| *H01H 3/46* | (2006.01) | |
| *H03K 17/97* | (2006.01) | |

(52) U.S. Cl.
CPC ........... *H03K 17/9505* (2013.01); *H01H 3/46* (2013.01); *H01H 11/00* (2013.01); *H01H 36/0073* (2013.01); *H03K 17/97* (2013.01); *H01H 2036/0086* (2013.01); *H03K 2217/94068* (2013.01)

(58) Field of Classification Search
CPC ...... G01D 18/00; G01D 5/12; G01D 5/24452; H01F 7/02; H01H 36/00; F16C 3/03
USPC ....................................................... 335/207
See application file for complete search history.

(56) References Cited

U.S. PATENT DOCUMENTS

| | | | | |
|---|---|---|---|---|
| 9,341,283 | B2 * | 5/2016 | Daniels ................. | B23Q 5/326 |
| 2013/0021123 | A1 * | 1/2013 | Merrifield ........... | F16K 37/0033 |
| | | | | 335/205 |

(Continued)

FOREIGN PATENT DOCUMENTS

EP    2 730 893 A1    5/2014

OTHER PUBLICATIONS

International Search Report and Written Opinion for Application No. PCT/US2019/015059, dated Jul. 25, 2019.

*Primary Examiner* — Shawki S Ismail
*Assistant Examiner* — Lisa N Homza
(74) *Attorney, Agent, or Firm* — Marshall, Gerstein & Borun LLP

(57) ABSTRACT

A target magnet mechanism for a proximity switch. The target magnet mechanism includes a plurality of magnets disposed in an alternating magnetic pole configuration forming a narrowed, polarity reversing magnetic field. A center magnet has a magnetic polarity opposite the magnetic polarity of a sensing magnet of the proximity switch. A flanking magnet includes a magnetic polarity opposite the magnetic polarity of the center magnet and the same as the sensing magnet. So configured, the plurality of magnets trigger the proximity switch to an activated state by pulling on a magnetic field of the proximity switch via the opposed polarity of the center magnet and the sensing magnet. In addition, the plurality of magnets release the proximity switch back to an unactivated state by pushing on the magnetic field of the proximity switch via the same polarity of the flanking magnet and the sensing magnet.

10 Claims, 9 Drawing Sheets

(56) References Cited

U.S. PATENT DOCUMENTS

| | | | |
|---|---|---|---|
| 2013/0169391 A1* | 7/2013 | LaFountain | H01H 19/06 335/219 |
| 2014/0062579 A1* | 3/2014 | Rigsby | H01H 19/06 327/517 |
| 2015/0034183 A1* | 2/2015 | Jennings | F16K 31/1655 137/524 |
| 2015/0034848 A1* | 2/2015 | Penning | F16K 37/0033 251/65 |
| 2015/0039142 A1* | 2/2015 | LaFountain | G01D 5/2525 700/282 |
| 2015/0233741 A1 | 8/2015 | Carpenter et al. | |
| 2016/0049054 A1* | 2/2016 | Simmons | G08B 7/062 340/815.4 |

\* cited by examiner

GO SWITCH
UN-ACTIVATED
(ELEVATION VIEW)

GO SWITCH
ACTIVATED

PLAN VIEW
Prior Art

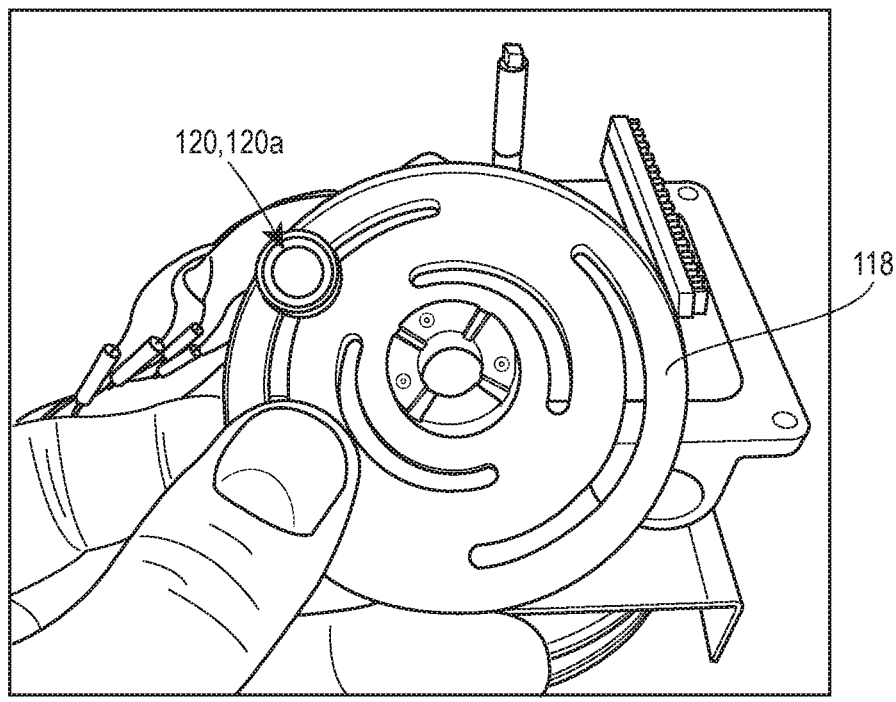
Figure 8A
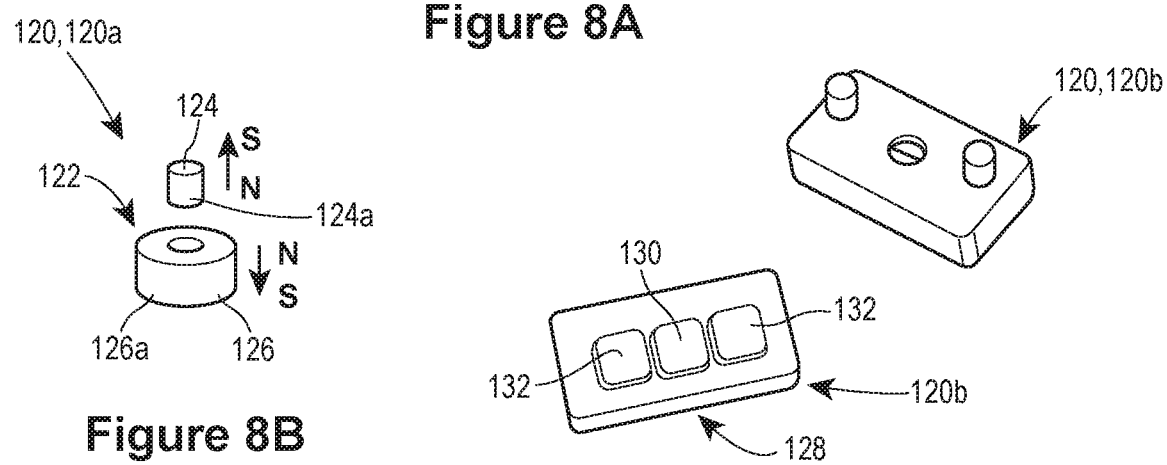
Figure 8B
Figure 9
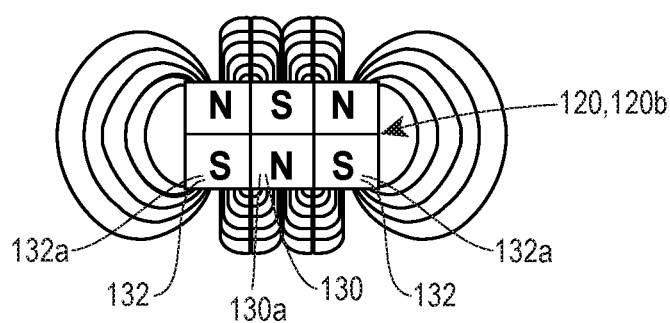
Figure 10

GO SWITCH UN-ACTIVATED

GO SWITCH ACTIVATED

TARGET MAGNET MECHANISM FOR PROXIMITY SWITCH

FIELD OF THE DISCLOSURE

This disclosure relates generally to magnetic proximity switches, and, more particularly, to a target magnet mechanism for proximity switch.

BACKGROUND

Magnetic proximity switches, also known as limit switches, are commonly used for linear position sensing. Generally, magnetic proximity systems typically include a target and a sensor. In one example, the target passes within a predetermined range of the sensor, the magnetic flux generated by the target, such as target magnet, causes the switch to close.

FIGS. 1A and 1B depict a conventional proximity switch 10 disposed within a switch box 12 operatively coupled to a rotary actuator 14 having a shaft 16. The switch box 12 includes an opening through which the shaft 16 passes. The switch box 12 houses both the conventional proximity switch 10 and a target carrier 18, such as a disk, having a target magnet 20 disposed thereon. The target carrier 18 also includes an opening for receiving the shaft 16, such that when the shaft 16 is rotated the target carrier 18 is rotated. To set the proximity switch 10 to trigger at a certain point of rotation of the actuator 14, the actuator 14, and, thus, the shaft 16, is rotated to that desired point. The proximity switch 10 is stationary; it never moves even when the shaft 16 moves.

When the shaft 16 is rotated, the target carrier 18 rotates to move the target magnet 20 into a sensing area of the proximity switch 10. When the target magnet 20 moves into the sensing area of the proximity switch 10, the proximity switch 10 is attracted to the target magnet 20, causing the proximity switch 10 to change states.

More specifically, and referring now to FIGS. 2-5, the conventional target magnet 20 is depicted in various states. For example, FIG. 2 depicts the conventional target magnet 20 outside of the sensing area SA (FIG. 5) of the proximity switch 10, and the proximity switch 10 is in an inactivated state. Upon movement of the target magnet 20 (such as via rotation of the shaft 16 by the actuator 14, which in turn rotates the target carrier 18) into the sensing area SA of the proximity switch 10, the proximity switch 10 is attracted to the target magnet 20 having an end with a magnetic polarity opposite the magnetic polarity of an end of the proximity switch 10. So configured, this arrangement causes the proximity switch 10 to move to an activated state, as depicted in FIG. 3.

However, once the proximity switch 10 is triggered or activated by the target magnet 20 to the activated state, stopping and immediately reversing the direction of the target magnet 20 does not immediately reset the proximity switch 10. Instead, due to hysteresis effects, the proximity switch 10 remains in the activated state until the target magnet 20 moves an amount sufficient to break the magnetic field outside of the sensing area SA. When this occurs, the proximity switch 10 is released back to the unactivated state, as depicted in FIG. 4.

Referring now to FIG. 5, the target magnet 20 is polarized with a pole N facing the opposite pole S of the proximity switch's sensing magnet 11 disposed adjacent to the target magnet 20. When the target magnet 20 is moved into the sensing area SA of the proximity switch 10, the proximity switch 10 is attracted to the target magnet 20, is actuated to the activated state, and remains in the activated state until the target magnet 20 moves out of the sensing area SA of the proximity switch 20, plus hysteresis. This hysteresis can significantly delay the return of the proximity switch 10 back to an unactivated state, for example. This also reduces the accuracy of determining a rotational position of the actuator 14 at any one time.

BRIEF SUMMARY OF THE DISCLOSURE

In accordance with one exemplary aspect of the present invention, a process control system comprises an actuator having a rotatable shaft. A proximity switch is coupled to the actuator and adjacent to the rotatable shaft and includes a sensing magnet with a magnetic polarity creating a sensing area. A target magnet mechanism coupled to the actuator. The target magnet mechanism has a plurality of magnets disposed in an alternating magnetic pole configuration forming a narrowed magnetic field of the target magnet mechanism. The plurality of magnets includes a center magnet having an end with a magnetic polarity opposite the magnetic polarity of the sensing magnet of the proximity switch and a flanking magnet disposed on at least one side of the center magnet. The flanking magnet includes a magnetic polarity opposite the magnetic polarity of the center magnet and the same as the magnetic polarity of the sensing magnet. So configured, and upon rotation of the rotatable shaft, the plurality of magnets move toward the sensing area of the proximity switch until the center magnet attracts the sensing magnet of the proximity switch, triggering the proximity switch into an activated state. When the target magnet mechanism is moved out of the sensing area, the flanking magnet repels the sensing magnet of the proximity switch, releasing the proximity switch into a deactivated state.

According to another aspect of the present disclosure, a target magnet mechanism for a proximity switch comprises a plurality of magnets disposed in an alternating magnetic pole configuration forming a narrowed magnetic field of the target magnet mechanism. The plurality of magnets includes a center magnet having an end with a magnetic polarity opposite the magnetic polarity of a sensing magnet of the proximity switch and a flanking magnet disposed on a side of the sensing magnet. The flanking magnet includes a magnetic polarity opposite the magnetic polarity of the center magnet and the same as the magnetic polarity of the sensing magnet. So configured, the plurality of magnets cause state changes of the proximity switch by one of pulling on a magnetic field of the proximity switch via the opposed polarity of the center magnet of the plurality of magnets and the sensing magnet of the proximity switch, triggering the proximity switch into an activated state, or pushing on the magnetic field of the proximity switch via the same polarity of the flanking magnet of the plurality of magnets and the sensing magnet of the proximity switch, releasing the proximity switch into the unactivated state.

According to yet another aspect of the present disclosure, a method of changing states of a proximity switch operatively coupled to an actuator comprises moving a plurality of magnets of a target magnet mechanism into a sensing area of the proximity switch, and triggering an activated state of the proximity switch via a center magnet of the plurality of magnets attracting a sensing magnet of the proximity switch, the center magnet having a magnetic polarity opposite the sensing magnet of the proximity switch. The method further comprises moving the plurality of magnets away from the sensing area of the proximity switch; and deactivating the proximity switch via a flanking magnet of the plurality of magnets repelling the sensing magnet of the proximity switch, the flanking magnet and the sensing magnet having the same magnetic polarities.

In further accordance with any one or more of the exemplary aspects, the process control system, the target magnet mechanism, or any method of the present disclosure may include any one or more of the following preferred forms.

In some preferred forms, the process control system may further comprise a target carrier coupled to the rotatable shaft. The target carrier may be a rotatable disk having a center opening for receiving the rotatable shaft, and the target magnet mechanism is disposed on the rotatable disk. In addition, the target carrier may include one or more target magnet mechanisms. Further, the flanking magnet may include a flanking magnet disposed on one or either side of the center magnet of the plurality of magnets, and each flanking magnet may have an end with a magnetic polarity the same as the magnetic polarity as an end of the sensing magnet of the proximity switch, such that the flanking magnets repel the sensing magnet and release the proximity switch back to an unactivated state when the target magnet mechanism moves out of the sensing area of the proximity switch. Still further, the flanking magnet may include a flanking magnet disposed on either side of the center magnet of the plurality of magnets, each flanking magnet having an end with a magnetic polarity opposite the magnetic polarity of the center magnet of the plurality of magnets.

In other preferred forms, the narrowed magnetic field of the target magnet mechanism may form a narrowed magnetic field and sensing area of the proximity switch. In addition, the narrowed magnetic field of the target magnet mechanism may decrease a triggering window of the proximity switch.

In still other forms, the target magnet mechanism may cause state changes of the proximity switch by one of: (1) pulling on a magnetic field of the proximity switch via the opposed polarity of the center magnet of the plurality of magnets and the sensing magnet of the proximity switch; or (2) pushing on a magnetic field of the proximity switch via the same polarity of the flanking magnet of the plurality of magnets and the sensing magnet of the proximity switch.

In other forms, moving a plurality of magnets of a target magnet mechanism into a sensing area of the proximity switch may comprise rotating a shaft operatively coupled to an actuator and a target carrier in a first direction, thereby rotating the plurality of magnets disposed on the target carrier relative to an axis of the shaft. In addition, triggering an activated state of the proximity switch via the center magnet of the plurality of magnets attracting a sensing magnet of the proximity switch may include pulling on a narrowed magnetic field of the proximity switch via the center magnet of the plurality of magnet attracting the sensing magnet of the proximity switch. Further, the method may also comprise narrowing a magnetic field of the target magnet mechanism and the proximity switch via the plurality of magnets of the target magnet mechanism. Still further, deactivating the proximity switch via a flanking magnet of the plurality of magnets repelling the sensing magnet of the proximity switch may comprise pushing on a magnetic field of the proximity switch via the flanking magnet of the plurality of magnets repelling the sensing magnet of the proximity switch.

Additional optional aspects and features are disclosed, which may be arranged in any functionally appropriate manner, either alone or in any functionally viable combination, consistent with the teachings of the disclosure. Other aspects and advantages will become apparent upon consideration of the following detailed description.

BRIEF DESCRIPTION OF THE DRAWINGS

FIG. 8A is a perspective view of an exemplary target magnet mechanism of the present disclosure;

FIG. 8B is a partially exploded perspective view of the target magnet mechanism of FIG. 8A;

FIG. 9 is a perspective view of another exemplary target magnet mechanism of the present disclosure;

FIG. 10 is another perspective view of the target magnet mechanism of FIG. 9;

DETAILED DESCRIPTION

The present disclosure is directed to a target magnet mechanism for a proximity switch, such as a magnetically biased, actuated proximity switch. The proximity switch includes a sensing magnet and is operatively coupled to an actuator coupled to a process control valve, for example. The target magnet mechanism includes a plurality of magnets disposed in an alternating pole configuration forming a narrowed magnetic field of the target magnet mechanism. The plurality of magnets includes a center magnet having a magnetic polarity opposite the magnetic polarity of the sensing magnet of the proximity switch and a flanking magnet disposed on a side of the center magnet. The flanking magnet includes a magnetic polarity opposite the magnetic polarity of the center magnet and the same as the magnetic polarity of the sensing magnet. So configured, the plurality of magnets pull on a magnetic field of the proximity switch via the opposed polarity of the center magnet of the plurality of magnets and the sensing magnet of the proximity switch, triggering the proximity switch to an activated state. In addition, the plurality of magnets push on the magnetic field of the proximity switch via the same polarity of the flanking magnet of the plurality of magnets and the sensing magnet of the proximity switch, releasing the proximity switch into the unactivated state. As a result, switch hysteresis effects are reduced, there is a narrower sensing area of the proximity switch, and resetting of the proximity switch is faster, as explained more below.

Figure 1A:
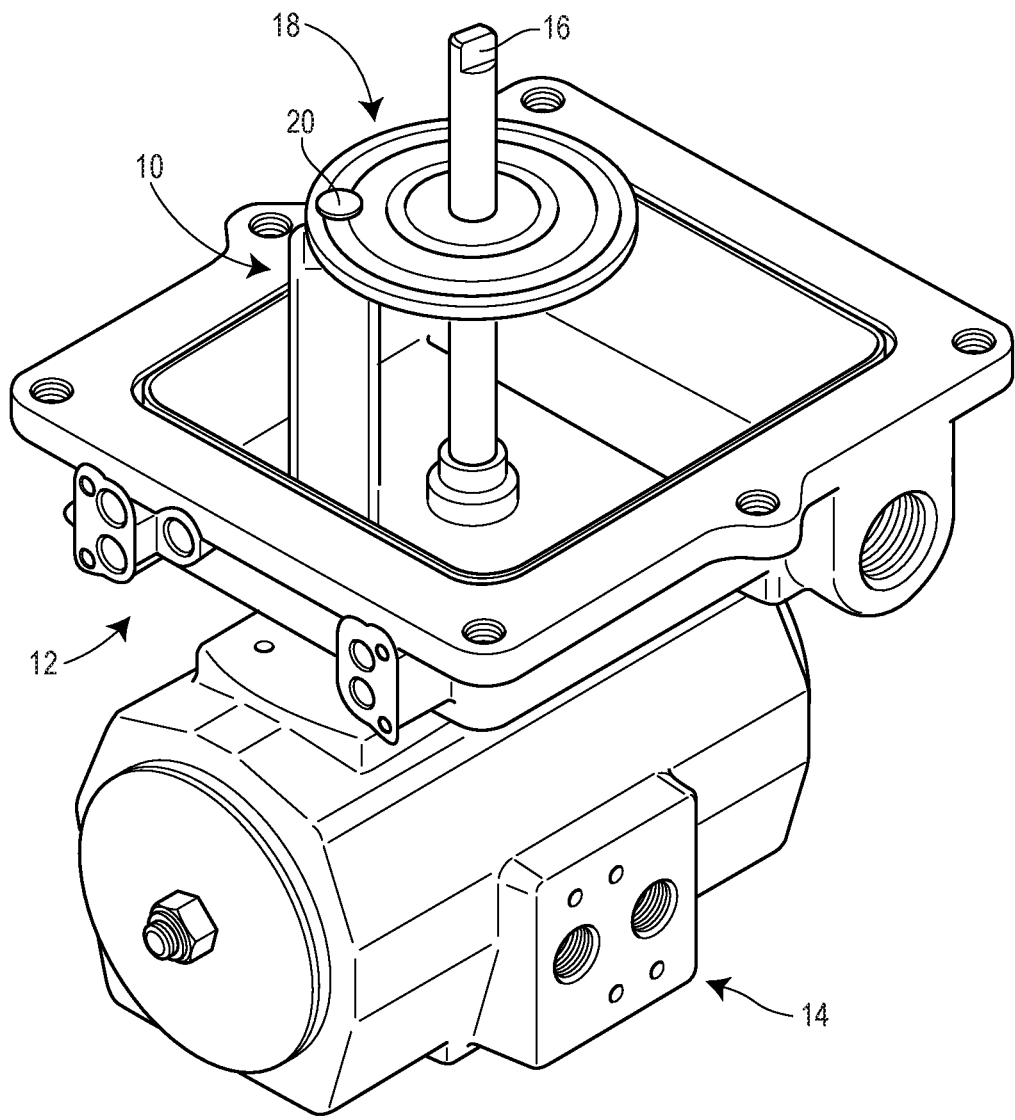
FIG. 1A is a perspective view of a conventional target magnet and a magnetic proximity switch disposed within a switch box having a lid removed.
Figure 1B:
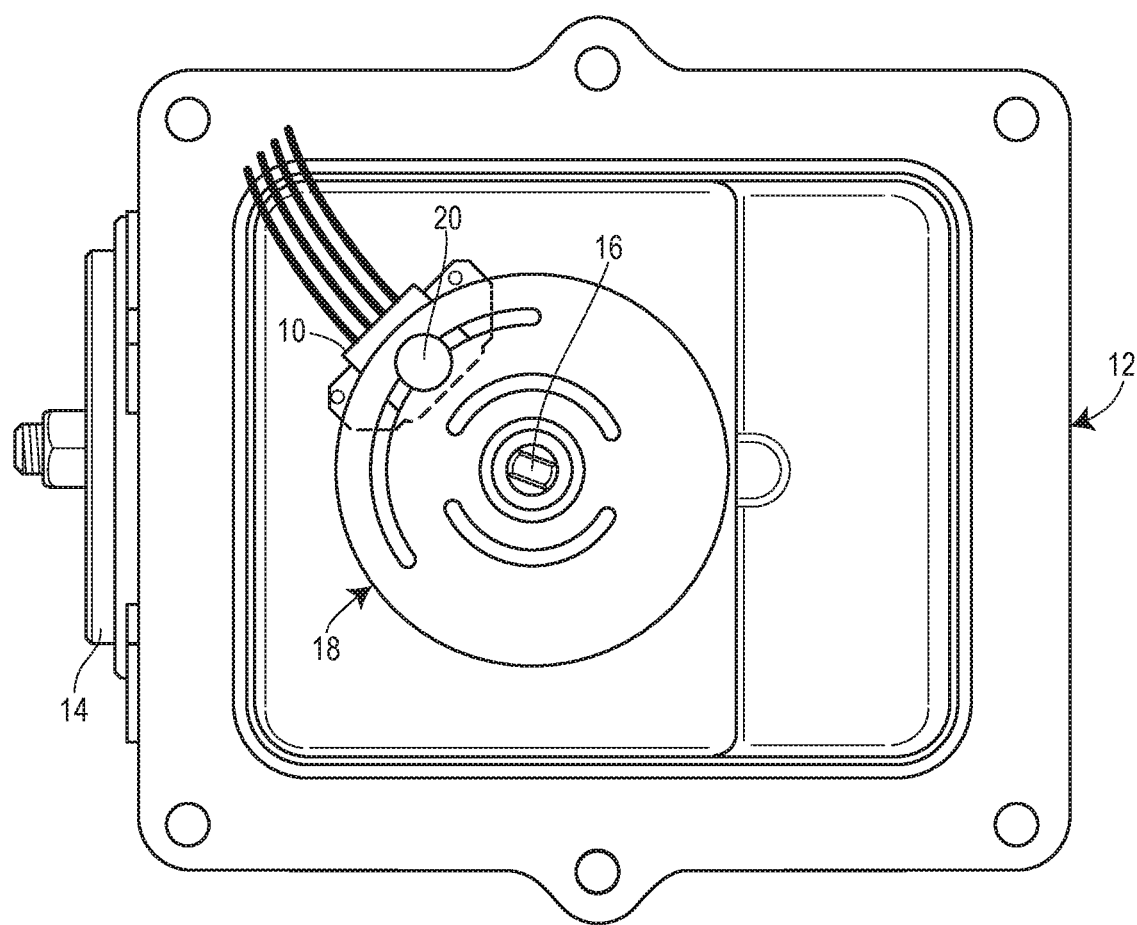
FIG. 1B is a top view of the conventional target magnet and magnetic proximity switch of FIG. 1.
Figure 2:
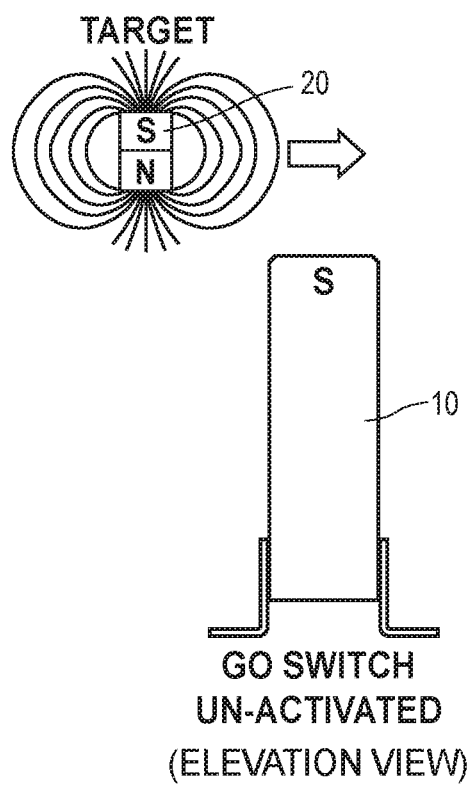
FIG. 2 is an elevation view of the conventional target magnet approaching the magnetic proximity switch in an unactivated state.
Figure 3:
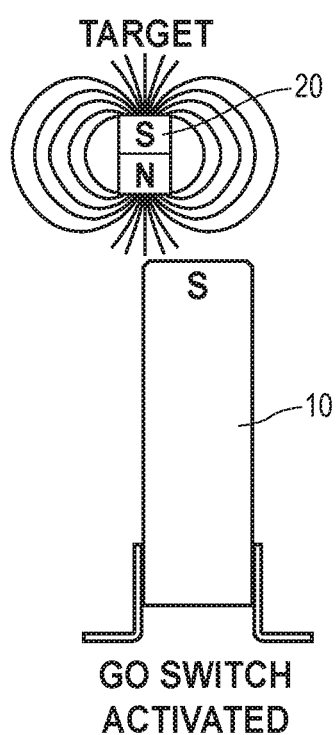
FIG. 3 is an elevation view of the conventional target magnet activating or triggering the magnetic proximity switch to an activated state.
Figure 4:
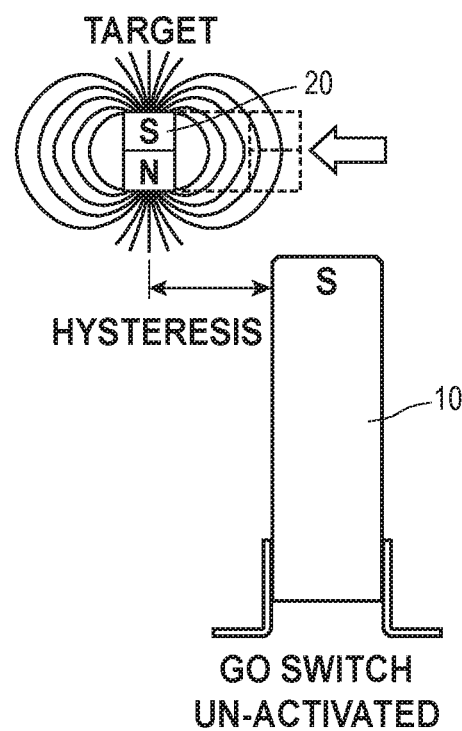
FIG. 4 is an elevation view of the conventional target magnet deactivating or releasing the magnetic proximity switch back to an unactivated state, depicting hysteresis effects.
Figure 5:
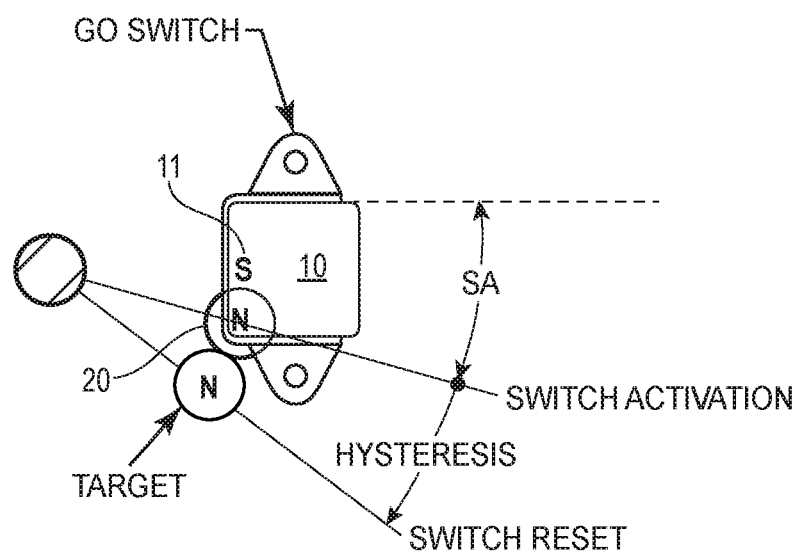
FIG. 5 is a top view of the conventional target magnet and magnetic proximity switch, depicting a magnetic field of the target magnet, a sensing field of the magnetic proximity switch, and a range of rotation of the target magnet to move into or out of the sensing field of the magnetic proximity switch.
Figure 6:
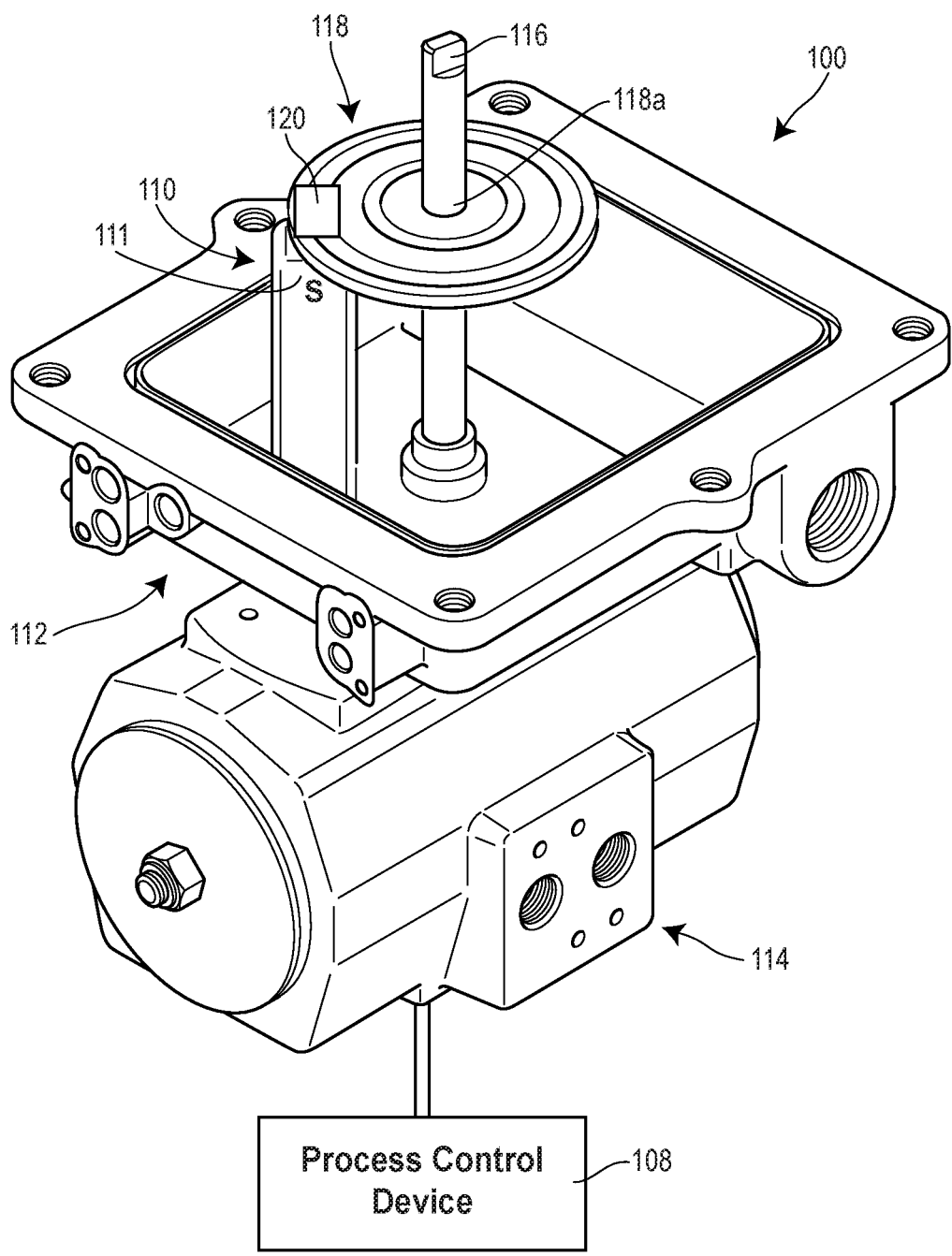
FIG. 6 is a perspective view of a target magnet mechanism according to an aspect of the present disclosure, the target mechanism coupled to a proximity switch.

Referring now to FIG. 6, a process control system 100 according to an aspect of the present disclosure is depicted. The process control system 100 includes a control device 108 and an actuator 114 operatively coupled to the control device 108. The control device 108 may be a valve controller, such as a Topworx™ Valvetop Discrete Valve Controller, or a control valve, such as a rotary control valve, and is operatively coupled to an output shaft 116 of the actuator 114. The output shaft 116 includes a longitudinal axis, and the actuator 114 rotates the shaft 116 relative to the longitudinal axis. A portion of a switch box 112 is coupled to the actuator 114 and includes a proximity switch 110 also coupled to the actuator 114 and adjacent the rotatable shaft 116. The proximity switch 110 includes a sensing magnet 111, as described more below.

Figure 7:
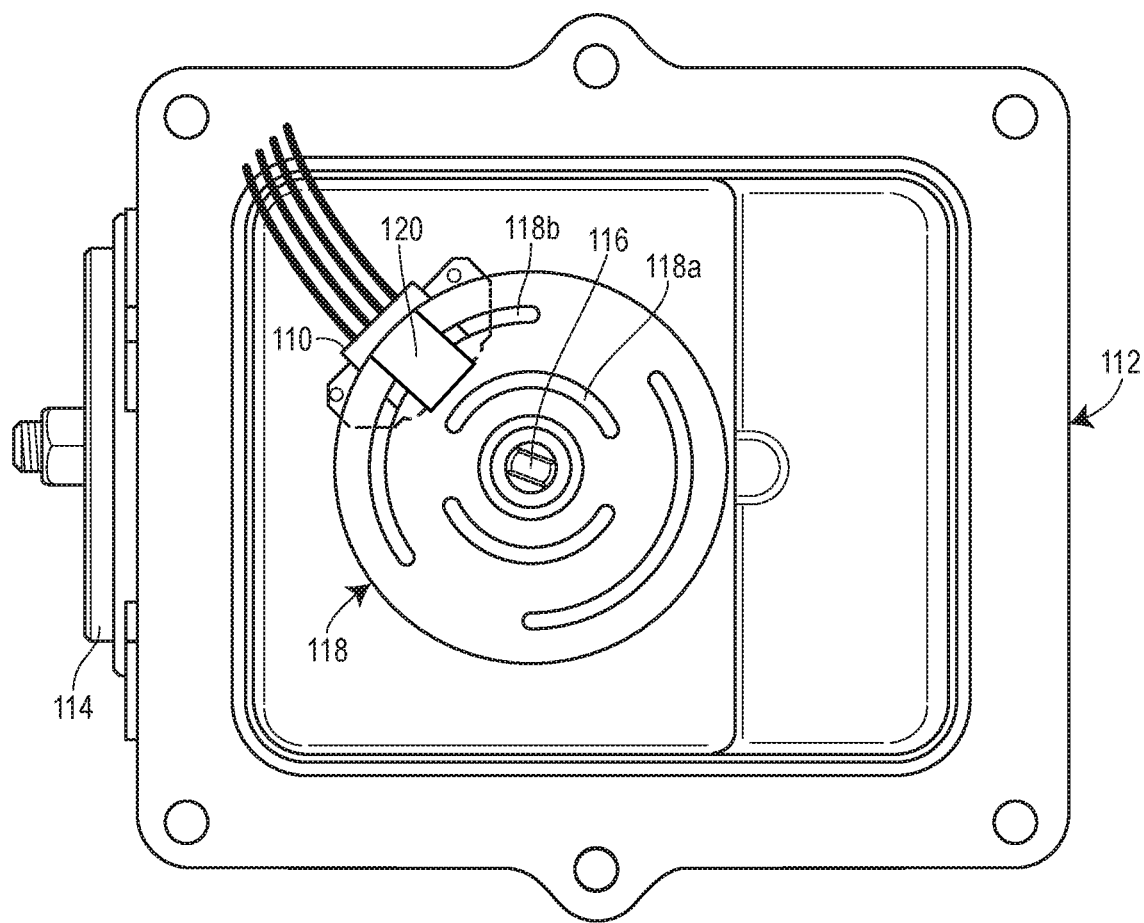
FIG. 7 is a top view of the target magnet mechanism and proximity switch of FIG. 6.

As also depicted in FIG. 7, a target carrier 118 is further coupled to the rotatable shaft 116 and receives a target magnet mechanism 120 of the present disclosure. In one example, the target carrier 118 is a rotatable disk having a center opening 118a for receiving the at least one target magnet mechanism 120. While one target magnet mechanism 120 is disposed on the target carrier 118 in FIG. 7, one or more of a pair of target magnet mechanisms 120 or more than two target magnet mechanisms may alternatively be disposed on the target carrier 118 and still fall within the scope of the present disclosure. At least one target magnet mechanism 120 is moveable within and along a curved slot 118b (FIG. 7) formed on the target carrier 118. One of ordinary skill in the art will further appreciate that the target carrier 118 may additionally or alternatively include various other shapes and still fall within the scope of the present disclosure.

Figure 14:
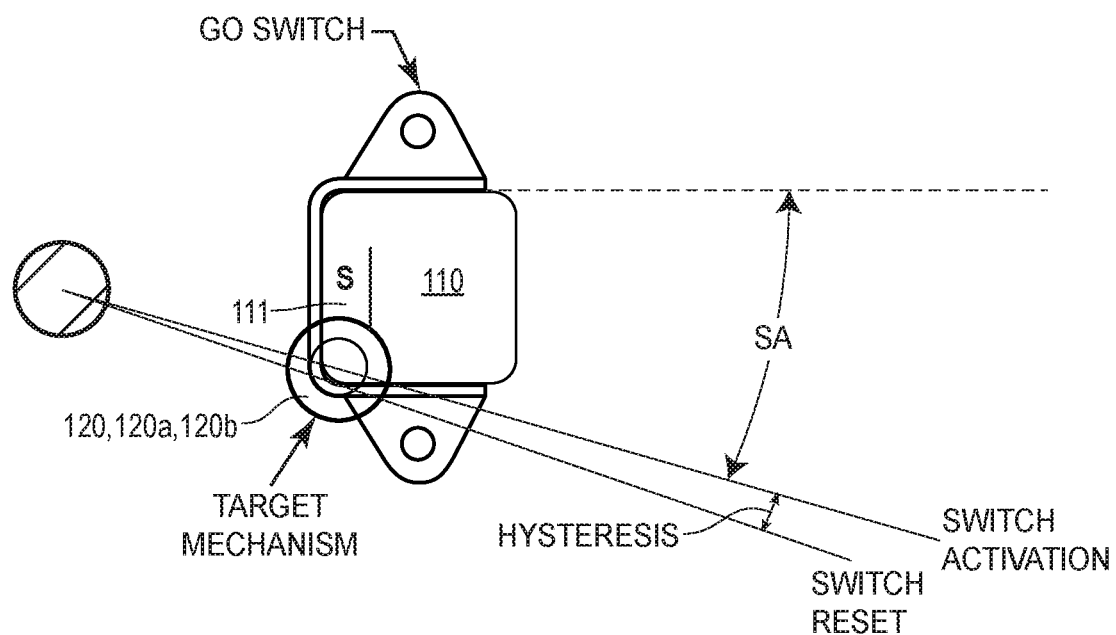
FIG. 14 is a top view of the target magnet mechanism of the present disclosure coupled to the proximity switch, depicting a magnetic field of the target magnet mechanism, a sensing area of the proximity switch, and a range of rotation of the target magnet mechanism to move one or more of into or out of the sensing area of the proximity switch.

Referring now to FIGS. 8A-10, various exemplary target magnet mechanisms 120 according to the present disclosure are depicted. For example, FIG. 8A depicts one exemplary target magnet mechanism 120a having a cylindrical shape. More specifically, the target magnet mechanism 120a includes a plurality of magnets 122 disposed in an alternating magnetic pole configuration (FIG. 8B) to form a narrowed magnetic field of the target magnet mechanism, as depicted in FIG. 14 and explained more below. The plurality of magnets 122 includes a center magnet 124 having an end 124a with a magnetic polarity opposite the magnetic polarity of the sensing magnet 111 of the proximity switch 110. For example, and in one example, the end 124a of the center magnet 124 may have an N magnetic polarity opposite the S magnetic polarity of the sensing magnet 111. Alternatively, and while not the depicted, the end 124a of the center magnet 124 may have an S magnetic polarity, and the sensing magnet 111 would then have an N magnetic polarity opposite the end 124a of the center magnet 124.

As further depicted in FIG. 8A, the plurality of magnets 122 may further include a flanking magnet 126, such as an outer magnet or a ring magnet, disposed on at least one side of the center magnet 124. The flanking magnet 126 includes a magnetic polarity opposite the magnetic polarity of the center magnet 124 and the same as the magnetic polarity of the sensing magnet 111. More specifically, and in one example, the flanking magnet 126 may have an end 126a with an S magnetic polarity, which is opposite the magnetic polarity N of the end 124a of the center magnet, for example, and the same as S magnetic polarity of the sensing magnet 111. Alternatively, the magnetic polarity of the end 126a of the flanking magnet 126 may be an N magnetic polarity, the magnetic polarity of the end 124a of the center magnet may then be an S magnetic polarity, and the magnetic polarity of the sensing magnet 111 of the proximity switch 110 may be an N magnetic polarity, such that the magnetic polarity of the flanking magnet 126 is again opposite the magnetic polarity of the center magnet 124 and the same as the magnetic polarity of the sensing magnet 111.

Referring now to FIGS. 9 and 10, another exemplary target magnet mechanism 120b is depicted. Unlike the target magnet mechanism 120a, the target magnet mechanism 120b may be rectangular in shape. As one of ordinary skill in the art will appreciate, each of the target magnet mechanisms 120a, 120b may take the form of various other shapes and still fall within the scope of the present disclosure.

Like the target magnet mechanism 120a, however, the target magnet mechanism 120b also includes a plurality of magnets 128 disposed in an alternating configuration, as depicted in FIG. 10, for example. This configuration forms a narrowed magnetic field of the target magnet mechanism 120b, as illustrated in FIG. 9, for example. In this example, the plurality of magnets 128 also includes a center magnet 130 having an end 130a with a magnetic polarity opposite the magnetic polarity of the sensing magnet 111 of the proximity switch 110. For example, and in one example, the end 130a may have an N magnetic polarity, as depicted in FIG. 10, which is opposite an S magnetic polarity of the sensing magnet 111 depicted in FIGS. 6 and 11, for example.

The plurality of magnets 128 may further include a flanking magnet 132 disposed on at least one side of the center magnet 130. In one example, the flanking magnet 132 includes a magnetic polarity opposite the magnetic polarity of center magnet 130 and the same as the magnetic polarity of the sensing magnet 111 of the proximity switch 110. More specifically, and as depicted in FIG. 10, for example, the flanking magnet 132 has an end 132a having an S magnetic polarity opposite to the end 130a of the center magnet 130 having an N magnetic polarity and the same as the S magnetic polarity of the sensing magnet 111 of the proximity switch 110.

In another example, and as depicted in FIGS. 9 and 10, the flanking magnet 132 may include a pair of flanking magnets, such that a flanking magnet 132 is disposed on either side of the center magnet 130 of the plurality of magnets 128. In this example, each flanking magnet 132 has an end 132a with a magnetic polarity the same as the magnetic polarity of the sensing magnet 111 of the proximity switch 110. As a result, the flanking magnets 132 disposed on either side of the center magnet 130 of the plurality of magnets 128 repel the sensing magnet 111 and release the proximity switch 110 back to an unactivated state, such as an at-rest state, as explained more below. In addition, the end 132*a* of each flanking magnet 132 has a magnetic polarity opposite the magnetic polarity of the end 130*a* of the center magnet 130, as depicted in FIG. 10, for example. As one of ordinary skill in the art will appreciate, the magnetic polarities of each of the flanking magnets 132, the center magnet 130, and the sensing magnet 111 may be reversed from what is depicted in FIGS. 10 and 14, for example, and still operate as described above and below, still falling within the scope of the present disclosure.

Figure 11:
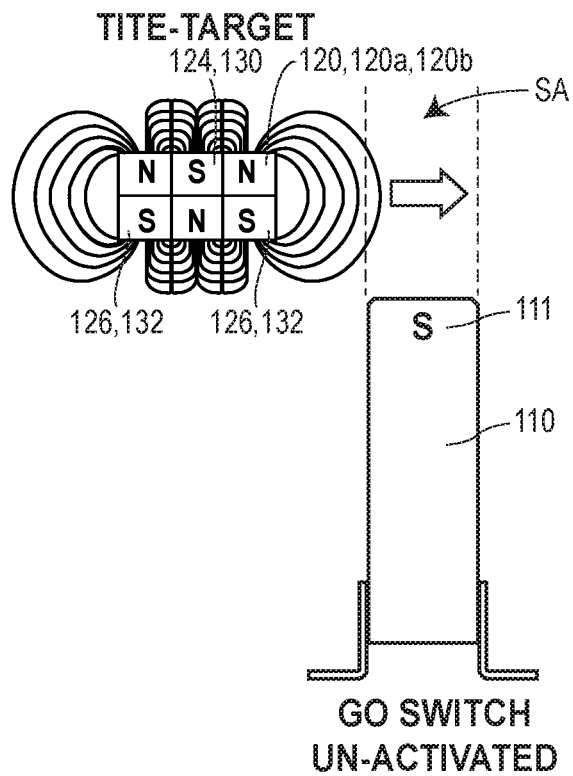
FIG. 11 is an elevation view of the target magnet mechanism of the present disclosure approaching the proximity switch in an unactivated state.

So configured, upon rotation of the shaft 116, the target carrier 118 and the target magnet mechanism 120, 120*a*, 120*b* having the plurality of magnets 122, 128 moves toward the sensing area SA (FIG. 14) of the proximity switch 110, as depicted in FIG. 11, for example. At this time, the proximity switch 110 is in an unactivated state, such as an at-rest state.

Figure 12:
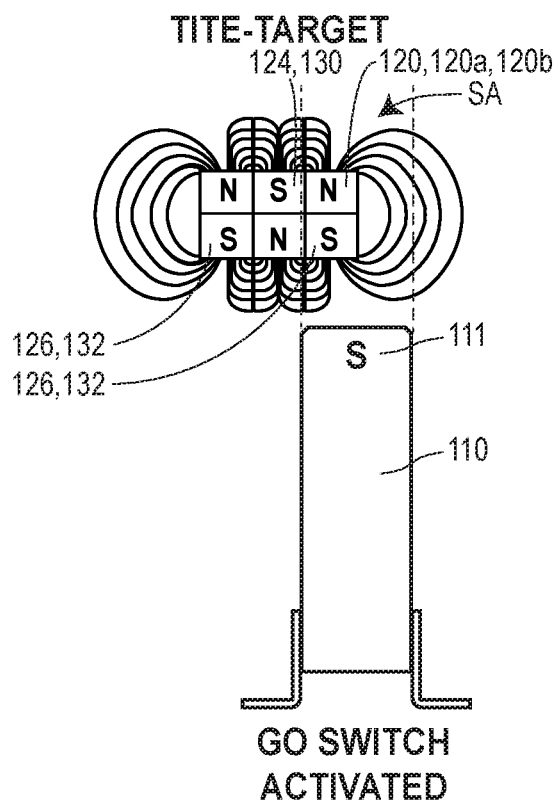
FIG. 12 is a perspective view of the target magnet mechanism of the present disclosure activating the proximity switch to an activated state.

As depicted in FIG. 12, the target magnet mechanism 120, 120*a*, 120*b* is moved further into the sensing area SA of the proximity switch 110 until the center magnet 124 (FIG. 8B), 130 (FIGS. 9 and 10) attracts the sensing magnet 111 of the proximity switch 110. At this time, the proximity switch 110 is triggered or activated into an activated state. Said another way, the target magnet mechanism 120, 120*a*, 120*b* changes a state of the proximity switch 110 from an at-rest or an unactivated state to an activated state by pulling on the magnetic field of the proximity switch 110 via the opposed polarity of the center magnet 124 (FIG. 8B), 130 (FIGS. 9 and 10) of the plurality of magnets 122, 128 and the sensing magnet 111 of the proximity switch. This movement triggers the proximity switch 110 into an activated state.

Figure 13:
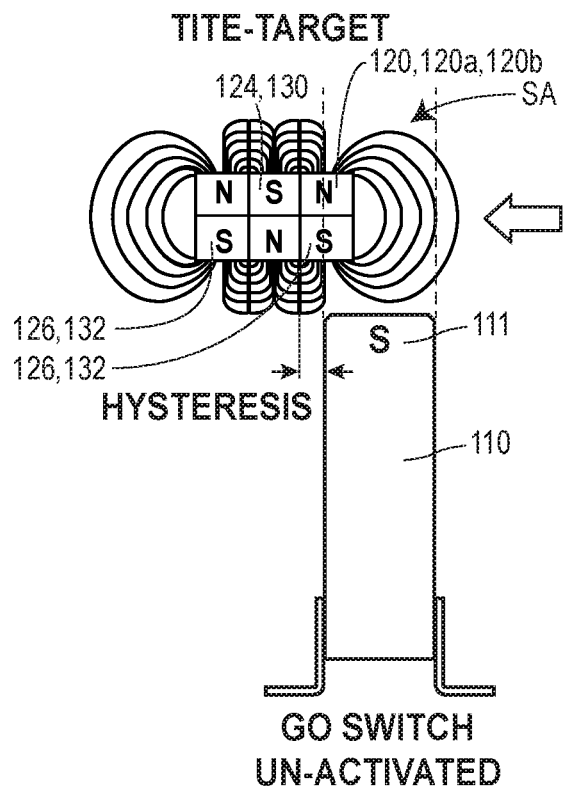
FIG. 13 is a perspective view of the target magnet mechanism of the present disclosure deactivating or releasing the proximity switch back to the unactivated state and a hysteresis window.

When the target magnet mechanism 120, 120*a*, 120*b* and, thus, the plurality of magnets 122 (FIG. 8B), 128 (FIG. 9) are moved out of the sensing area SA, the flanking magnet 126 (FIG. 8B), 132 (FIGS. 9 and 10) repels the sensing magnet 111 of the proximity switch 110. As a result, the proximity switch 110 is released into a deactivated or unactivated state, such as an at-rest state, as depicted in FIG. 13. Said another way, because the flanking magnets 126 (FIG. 8B), 132 (FIGS. 9 and 10) have the same polarity as the sensing magnet 111, such as the primary magnet, of the proximity switch 110, the flanking magnets 126 (FIG. 8B), 132 (FIGS. 9 and 10) repel the proximity switch 110 back to its at-rest position when the target magnet mechanism 120, 120*a*, 120*b* moves out of the sensing area SA.

As a result, and as depicted in FIG. 13, a normally closed contact pressure is increased while the target magnet mechanism 120, 120*a*, 120*b* is in front of the sensing area SA of the proximity switch 110, for example. In other words, the target magnet mechanism 120, 120*a*, 120*b* causes a state change of the proximity switch 110 from an activated state to a deactivated or unactivated state by pushing on the magnetic field of proximity switch 110 via the same polarity of the flanking magnet 126 (FIG. 8B), 132 (FIGS. 9 and 10) and the sensing magnet 111 of the proximity switch 110. This movement releases the proximity switch 110 into the unactivated state.

Referring now to FIG. 14, some of the advantages of the target magnet mechanism 120, 120*a*, 120*b* of the present disclosure are depicted. For example, the plurality of magnets 122, 128 of FIGS. 8B and 9, respectively, in an alternating magnetic pole configuration, for example, forms a narrowed magnetic field of the target magnet mechanism 120, 120*a*, 120*b*. As a result, a narrowed magnetic field and sensing area SA of the proximity switch 110 is formed. In addition, the narrowed magnetic field of the target magnet mechanism 120, 120*a*, 120*b* decreases a triggering window of the proximity switch 110. Moreover, and as further depicted in FIG. 14, the narrowed sensing area SA results in a general reduction of a total rotation range of the target magnet mechanism 120, 120*a*, 120*b*. Specifically, the hysteresis effects are significantly reduced and the sensing area SA range of rotation, such as deadband, is also reduced. As a result, the target magnet mechanism 120, 120*a*, 120*b* has a tighter or squeezed magnetic field, causing the switch to activate and release in a narrower window and at a faster rate, for example.

So configured, the control valve system 100 and the target magnet mechanism 120, 120*a*, 120*b* may operate according to the exemplary method. Specifically, a method of changing states of a proximity switch of the control valve system 100, for example, may include moving the plurality of magnets 122, 128 of the target magnet mechanism 120, 120*a*, 120*b* into the sensing area SA of the proximity switch 110. In one example, moving the plurality of magnets 122, 128 of the target magnet mechanism 120, 120*a*, 120*b* into the sensing area SA of the proximity switch 110 may include rotating the shaft 116 operatively coupled to the actuator 114 and the target carrier 118 in a first direction, such as a clockwise direction, thereby rotating the plurality of magnets 122, 128 disposed on the target carrier 118 relative to an axis of the shaft 116.

The method may further include triggering an activated state of the proximity switch 110 via the center magnet 124, 130 of the plurality of magnets 122, 128, attracting the sensing magnet 111 of the proximity switch 110 to the center magnet 124, 130 having a polarity opposite the sensing magnet 111, as explained more above. In one example, triggering the activated state of the proximity switch 110 via the center magnet 124, 130 attracting the sensing magnet 111 of the proximity switch 110 includes pulling on the narrowed magnetic field of the proximity switch 110 via the center magnet 124, 130 of the plurality of magnets 122, 128 attracting the sensing magnet 111 of the proximity switch 110.

The method may still further include moving the plurality of magnets 122, 128 away from the sensing area SA of the proximity switch 110. In one example, moving the plurality of magnets 122, 128 away from the sensing area SA of the proximity switch 110 include rotating the plurality of magnets 122, 128 in a second direction, such as a counter-clockwise direction, opposite the first direction in which the plurality of magnets 122, 128 are rotated to begin activation of the proximity switch 110, for example.

The method may still also include deactivating the proximity switch 110 via the flanking magnet 126, 132 of the plurality of magnets 122, 128 repelling the sensing magnet 111 of the proximity switch 110, the flanking magnet 126, 132 and the sensing magnet 111 having the same magnetic polarities, as described above. In one example, deactivating the proximity switch 110 via the flanking magnet 126, 132 of the plurality of magnets 122, 128 repelling the sensing magnet 111 of the proximity switch 110 may include pushing on the magnetic field of the proximity switch 110 via the flanking magnet 126, 132 repelling the sensing magnet 111 of the proximity switch 110.

In view of the foregoing, one of ordinary skill in the art will appreciate the many advantages of the target magnet mechanism 120, 120*a*, 120*b* and related methods of the present disclosure. For example, the use of multiple magnets in the plurality of magnets 122, 128, the magnets stacked with the poles aligned, for example, squeezes, tightens and narrows the magnetic field of the target magnet mechanism 120, 120*a* and 120*b* and the magnetic field of the proximity switch 110. As a result, the range of rotation of the target magnet mechanism 120, 120a, 120b is reduced, allowing the proximity switch 110 to change states at a faster rate than conventional target magnets used with the proximity switches. Further, the narrowed magnetic field of the target magnet mechanism 120, 120a, 120b results in the proximity switch 110 being triggered only in the narrowed sensing area, such as the dead band window, of the proximity switch 110.

Moreover, the target magnet mechanism 120, 120a, 120b of the present disclosure also significantly reduces hysteresis effects of conventional target magnets and proximity switches. This reduces the time the proximity switch 110 remains in the activated state, as the target magnet mechanism 120, 120a, 120b has a shorter range of rotational movement to move out of the sensing area SA of the proximity switch 110 to deactivate the proximity switch 110, for example. Overall, the configuration of the plurality of magnets 122, 128 and the repelling magnetic fields described above result in tighter sensing and, therefore, faster actuation and deactivation of the proximity switch 110.

Although certain control valves and systems have been described herein in accordance with the teachings of the present disclosure, the scope of coverage of this patent is not limited thereto. On the contrary, while the invention has been shown and described in connection with various preferred embodiments, it is apparent that certain changes and modifications, in addition to those mentioned above, may be made. This patent covers all embodiments of the teachings of the disclosure that fairly fall within the scope of permissible equivalents. Accordingly, it is the intention to protect all variations and modifications that may occur to one of ordinary skill in the art.

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one implementation," "one embodiment," "an implementation," or "an embodiment" means that a particular element, feature, structure, or characteristic described in connection with the implementation is included in at least one implementation. The appearances of the phrase "in one implementation" or "in one embodiment" in various places in the specification are not necessarily all referring to the same implementation.

Some implementations may be described using the expression "coupled" along with its derivatives. For example, some implementations may be described using the term "coupled" to indicate that two or more elements are in direct physical or electrical contact. The term "coupled," however, may also mean that two or more elements are not in direct contact with each other, but yet still co-operate or interact with each other. The implementations are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the implementations herein. This is done merely for convenience and to give a general sense of the invention. This description should be read to include one or at least one and the singular also includes the plural unless it is obvious that it is meant otherwise.

Moreover, the patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

While various embodiments have been described above, this disclosure is not intended to be limited thereto. Variations can be made to the disclosed embodiments that are still within the scope of the appended claims.

What is claimed is:

1. A process control system comprising:
an actuator having a rotatable shaft;
a proximity switch coupled to the actuator and adjacent the rotatable shaft, the proximity switch having a sensing magnet with a magnetic polarity creating a sensing area; and
a target magnet mechanism coupled to the proximity switch, the target magnet mechanism having a plurality of magnets, the plurality of magnets including a center magnet having an end with a magnetic polarity opposite the magnetic polarity of the sensing magnet of the proximity switch and a flanking magnet disposed on at least one side of the center magnet, the flanking magnet including a magnetic polarity opposite the magnetic polarity of the center magnet and the same as the magnetic polarity of the sensing magnet,
wherein, upon rotation of the rotatable shaft, the plurality of magnets move toward the sensing area of the proximity switch until the center magnet attracts the sensing magnet of the proximity switch, triggering the proximity switch into an activated state, and, when the target magnet mechanism is moved out of the sensing area, the flanking magnet repels the sensing magnet of the proximity switch, releasing the proximity switch into a deactivated state.

2. The system of claim 1, further comprising a target carrier coupled to the rotatable shaft, the target magnet mechanism coupled to the target carrier, wherein the target carrier is a rotatable disk having a center opening for receiving the rotatable shaft, and the target magnet mechanism is disposed on the rotatable disk.

3. The system of claim 1, wherein the flanking magnet includes a flanking magnet disposed on either side of the center magnet of the plurality of magnets, each flanking magnet having an end with a magnetic polarity the same as the magnetic polarity as an end of the sensing magnet of the proximity switch, such that the flanking magnets repel the sensing magnet and release the proximity switch back to an unactivated state when the target magnet mechanism moves out of the sensing area of the proximity switch.

4. The system of claim 1, wherein the flanking magnet includes a flanking magnet disposed on either side of the center magnet of the plurality of magnets, each flanking magnet having an end with a magnetic polarity opposite the magnetic polarity of the center magnet of the plurality of magnets.

5. The system of claim 1, wherein the target magnet mechanism causes state changes of the proximity switch by one of: (1) pulling on a magnetic field of the proximity switch via the opposed polarity of the center magnet of the plurality of magnets and the sensing magnet of the proximity switch; or (2) pushing on a magnetic field of the proximity switch via the same polarity of the flanking magnet of the plurality of magnets and the sensing magnet of the proximity switch.

6. A target magnet mechanism for a proximity switch having a sensing magnet and operatively coupled to an actuator having a shaft, the target magnet mechanism comprising:
a plurality of magnets, the plurality of magnets including a center magnet having an end with a magnetic polarity opposite the magnetic polarity of the sensing magnet of the proximity switch and a flanking magnet disposed on a side of the sensing magnet, the flanking magnet including a magnetic polarity opposite the magnetic polarity of the center magnet and the same as the magnetic polarity of the sensing magnet,
the plurality of magnets causing state changes of the proximity switch by one of pulling on a magnetic field of the proximity switch via the opposed polarity of the center magnet of the plurality of magnets and the sensing magnet of the proximity switch, triggering the proximity switch into an activated state, or pushing on the magnetic field of the proximity switch via the same polarity of the flanking magnet of the plurality of magnets and the sensing magnet of the proximity switch, releasing the proximity switch into the unactivated state.

7. The target magnet mechanism of claim 6, wherein the flanking magnet includes a flanking magnet disposed on either side of the center magnet of the plurality of magnets, each flanking magnet having an end with a magnetic polarity the same as the magnetic polarity of an end of the sensing magnet of the proximity switch, such that the flanking magnets repel the sensing magnet and release the proximity switch to an unactivated state when the target magnet mechanism moves out of the sensing area of the proximity switch.

8. The mechanism of claim 6, wherein the flanking magnet includes a flanking magnet disposed on either side of the center magnet of the plurality of magnets, each flanking magnet having an end with a magnetic polarity opposite the magnetic polarity of the center magnet of the plurality of magnets.

9. The mechanism of claim 6, wherein the plurality of magnets are adapted to move into a sensing area of the proximity switch to trigger the proximity switch into an activated state when the center magnet of the plurality of magnets attracts the sensing magnet of the proximity switch.

10. The mechanism of claim 6, wherein the plurality of magnets are adapted to move away from a sensing area of the proximity switch to automatically release the proximity switch into an unactivated state when the flanking magnet of the plurality of magnets repels the sensing magnet of the proximity switch.

* * * * *